US010993323B2

(12) United States Patent
Elsing et al.

(10) Patent No.: US 10,993,323 B2
(45) Date of Patent: Apr. 27, 2021

(54) STACKABLE PRINTED CIRCUIT BOARD

(71) Applicants: Cody Elsing, Middleton, WI (US);
Matthew Moseman, Sauk City, WI (US)

(72) Inventors: Cody Elsing, Middleton, WI (US);
Matthew Moseman, Sauk City, WI (US)

(*) Notice: Subject to any disclaimer, the term of this patent is extended or adjusted under 35 U.S.C. 154(b) by 0 days.

(21) Appl. No.: 16/740,441

(22) Filed: Jan. 12, 2020

(65) Prior Publication Data
US 2020/0229305 A1 Jul. 16, 2020

Related U.S. Application Data

(60) Provisional application No. 62/791,885, filed on Jan. 14, 2019.

(51) Int. Cl.
*H05K 1/11* (2006.01)
*H05K 1/14* (2006.01)
(Continued)

(52) U.S. Cl.
CPC .............. *H05K 1/144* (2013.01); *H05K 1/116* (2013.01); *H05K 2201/10303* (2013.01)

(58) Field of Classification Search
CPC .. H01R 12/7076; H01R 12/716; H01R 12/52; H01R 12/7082; H01R 12/7088; H01R 12/50; H01R 12/70; H01R 12/88; H01R 13/6585; H05K 1/116; H05K 1/144; H05K 1/11; H05K 1/14; H05K 1/08;
(Continued)

(56) References Cited

U.S. PATENT DOCUMENTS 4,133,592 A * 1/1979 Cobaugh ................ H01R 12/88
439/260
4,773,868 A 9/1988 Heinecke
(Continued)

FOREIGN PATENT DOCUMENTS

JP S555476 U 1/1980

OTHER PUBLICATIONS

Freetronics Pty Ltd, Stacking Arduino Shields, last accessed Jan. 4, 2020, https://www.freetronics.com.au/pages/stacking-arduino-shields#.XhAvzEdKiM9.

*Primary Examiner* — Timothy J Thompson
*Assistant Examiner* — Guillermo J Egoavil
(74) *Attorney, Agent, or Firm* — Theorem Law, LLC; John M. Osmanski

(57) ABSTRACT

A first stackable printed circuit board with at least a two sets of set of male and female connectors each arranged inline with each other, and each configured in a mirrored pin configuration is arranged along opposing sides of an equilateral geometric shape on both the top and bottom face of the first board in order to attach, by the connectors, to a second stackable printed circuit board with the same male and female connector configuration and arrangement as the first board on at least one face regardless of the axial rotation of first stackable printed circuit board about the X or Y axis by 180 degrees and/or by axial rotation about the Z axis by n/360 degrees where n is the amount of sides of the geometric shape which contain a connector set, thereby allowing for up to n*2 different connection configurations between the first and second printed circuit boards.

14 Claims, 5 Drawing Sheets

(51) Int. Cl.
*H01R 12/50* (2011.01)
*H01R 12/70* (2011.01)
*H01R 12/88* (2011.01)
*H05K 7/14* (2006.01)

(58) Field of Classification Search
CPC .......... H05K 3/368; H05K 7/023; H05K 7/14;
H05K 2201/10303
USPC ........................... 361/736; 439/74; 338/17 M
See application file for complete search history.

(56) References Cited

U.S. PATENT DOCUMENTS

| | | | |
|---|---|---|---|
| 5,420,754 A | | 5/1995 | Segelken et al. |
| 5,490,041 A | | 2/1996 | Furukawa et al. |
| 5,568,356 A | | 10/1996 | Schwartz |
| 5,568,361 A | | 10/1996 | Ward et al. |
| 5,575,686 A | | 11/1996 | Noschese |
| 5,691,885 A | | 11/1997 | Ward et al. |
| 5,707,242 A | * | 1/1998 | Mitra .................. H01R 12/716 439/74 |
| 6,469,901 B1 | * | 10/2002 | Costner .................... G06F 1/18 361/730 |
| 6,964,574 B2 | * | 11/2005 | Pavesi ...................... H05K 1/14 439/76.1 |
| 2006/0134945 A1 | | 6/2006 | Kuo |
| 2012/0106052 A1 | | 5/2012 | Odlineal et al. |
| 2012/0244823 A1 | | 9/2012 | Scharf et al. |

* cited by examiner

STACKABLE PRINTED CIRCUIT BOARD

CROSS REFERENCE TO RELATED APPLICATIONS

U.S. Provisional application No. 62/791,885, filed on Jan. 14, 2019.

BACKGROUND OF THE INVENTION

1. Field of the Invention

The present invention relates generally to stackable printed circuit boards.

2. Background

Printed circuit boards are utilized in numerous industrial and consumer applications. Commonly a system will include one circuit board which contains a microcontroller that can be preprogrammed or programmed by a user as desired and at least one (but often numerous) additional components or peripheral boards by connecting the additional boards to the microcontroller board in some manner. Common additional boards (or shields) are utilized to add wireless network connectivity; add additional memory or hard drive storage; or control motors, relays, switches and LEDs. In addition, currently in hardware/software systems like Arduino some microcontroller boards utilize special purpose pins of connectors for communication interfaces like SPI, Serial, and I2C. Some peripheral boards however use these same pins for other purposes which means that additional adding or stacking of boards is not possible. Further, many stackable development board systems allow only a certain set of peripheral circuit boards to be stacked due to limited pin utilization of connectors. In addition, some systems may only allow one or a few different peripherals to be stacked or connected together which requires compromise to the overall system design. Yet other systems utilize a standard cable to interface multiple boards together which can lead to reliability issues as the cables can easily break. Further, another problem with current solutions is that mounting each board in a system is difficult as each board needs to be individually secured to an enclosure, which partially or completely encloses the system. Thus it would be advantageous to develop a solution for connecting or stacking printed circuit boards together which remedies all of the aforementioned problems and allows groups of boards to be connected in a convenient and space efficient format.

SUMMARY OF THE INVENTION

The invention relates, in one embodiment, to a first stackable printed circuit board with connector sets comprised of a male connector and a female connector in a mirrored pin configuration and arranged in an equilateral geometric shape on one face of the board configured to connect via the connectors to a second stackable printed circuit board with the same connector set configuration as the first board regardless of the n/360 degree rotation of the first board axially about the Z axis where n is the amount of sides of the equilateral geometric shape which contain a connector set.

The invention relates, in another embodiment to a first stackable printed circuit board with connector sets comprised of a male connector and a female connector in a mirrored pin configuration and arranged in an equilateral geometric shape on the top and bottom face of the board configured to connect via the connectors to a second stackable printed circuit board with the same connector set configuration on at least one face as the first board regardless of the n/360 degree rotation of the first board axially about the Z axis or 180 degree rotation about the X or Y axis where n is the amount of sides of the equilateral geometric shape which contain a connector set.

The invention relates, in another embodiment, to a first notched stackable printed circuit board with connector sets comprised of a male connector and a female connector in a mirrored pin configuration and arranged in an equilateral geometric shape on one face of the board configured to connect via the connectors to a second notched stackable printed circuit board with the same connector set configuration as the first board regardless of the n/360 degree rotation of the first board axially about the Z axis where n is the amount of sides of the equilateral geometric shape which contain a connector set.

The invention relates, in another embodiment to a first stackable printed circuit board with connector sets comprised of a male connector and a female connector in a mirrored pin configuration and arranged in an equilateral geometric shape on the top and bottom face of the board configured to connect via the connectors to a second stackable printed circuit board with the same connector set configuration on at least one face as the first board regardless of the n/360 degree rotation of the first board axially about the Z axis or 180 degree rotation about the X or Y axis where n is the amount of sides of the equilateral geometric shape which contain a connector set.

The invention relates, in another embodiment to a system of stacked printed circuit boards including at least one termination board and at least one peripheral board.

The invention relates, in another embodiment to a method of for stacking printed circuit boards. The method also includes rotation of a first printed circuit board axially about a Z axis amount determined by the amount of connector sets on the top or bottom face of the printed circuit board and/or rotating the first printed circuit but axially about the X or Y axis 180 degrees and mating the connector sets on the first printed circuit board with the connector sets on the top face or bottom face of a second printed circuit board.

DETAILED DESCRIPTION OF THE INVENTION

Figure 1:
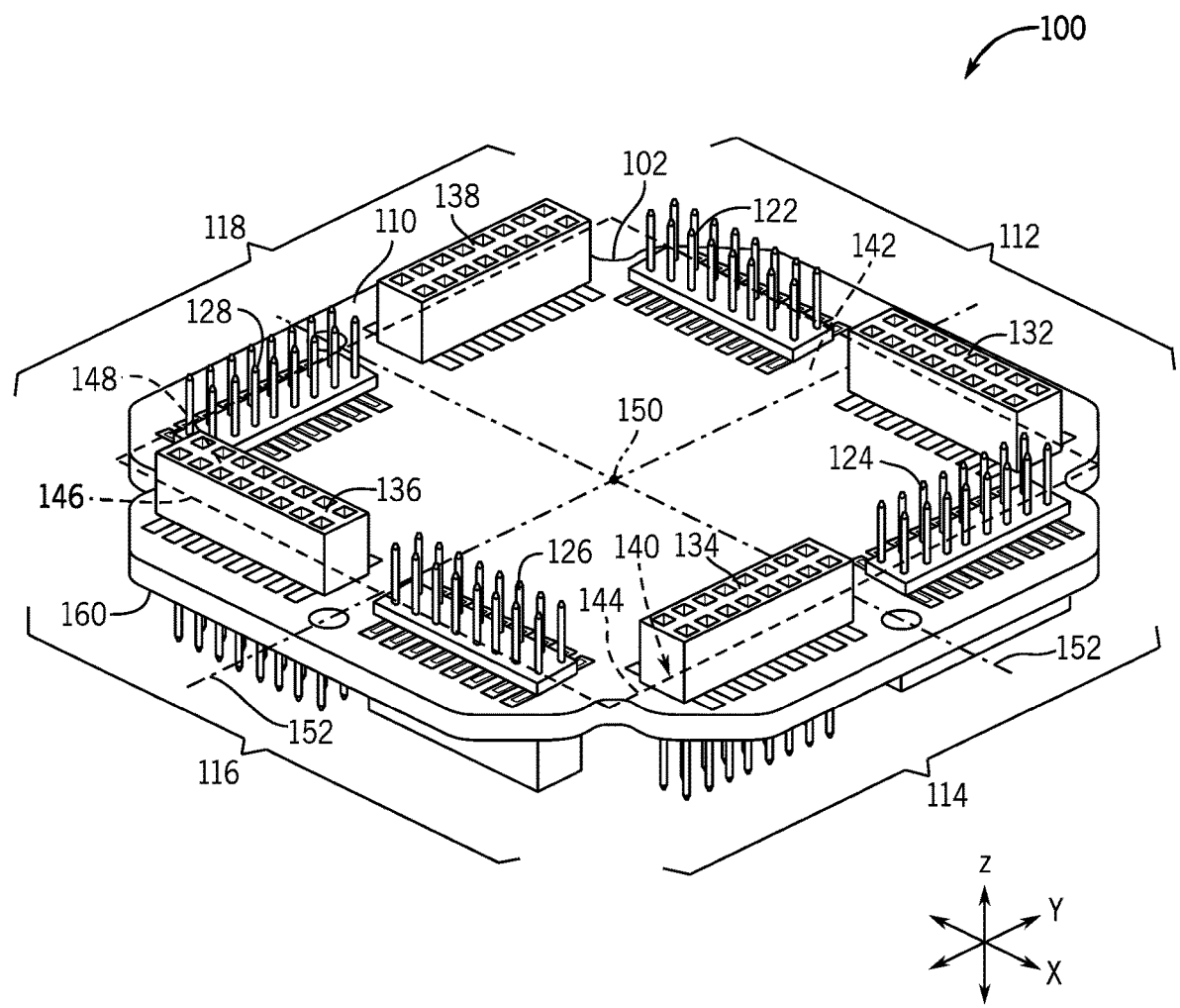
FIG. 1. is a perspective view of an embodiment of the present invention.

A stackable printed circuit board apparatus and system will now be described with references in FIGS. 1-6. Turning to the drawings, where the reference characters indicate corresponding elements throughout the several figures, attention is first directed to FIG. 1 where a perspective view of an embodiment of a stackable printed circuit board apparatus is shown, illustrating its composition, the apparatus is generally indicated by reference character 100. Board 100 can serve many functions including as a single board computer, microprocessor, microcontroller, shield, peripheral, or expansion board to add input, output or protocol functionality to an electrical system. Some examples of such boards would add USB compatibility, WIFI capability, push button input 802, LED display output or any known or developed input or output signals desired. The stackable printed circuit board 100 comprises a top face 110 and a bottom face 160. Top face 110 comprises a plurality of connector sets 112, 114, 116 and 118 configured in an equilateral geometric shape 140 with four or more sides and a central point 150. Board 100 connects to another board (such as a microcontroller or a peripheral board) by at least one connector set 112, 114, 116 and/or 118. At least one connector set is located along each of at least two sides of an equilateral geometric shape 140; in the current embodiment one connector set is located along each side of shape 140. That is, in the current embodiment connector set 112 is located along the edge of side 142, connector set 114 is located along edge of side 144, connector set 116 is located along the edge of side 146 and connector set 118 is located along the edge of side 148. Each connector set comprises an even number of opposing gender connectors per set. That is, each connecter set comprises at least one male connector and at least one female connector. In addition, each male connector and female connector within a connector set has the same number of pins and a mirrored pinout of one another. Further, each connector set is the same material composition on board 100. As such, connector set 112 comprises male connector 122 and female connector 132, connector set 114 comprises male connector 124 and female connector 134, connector set 116 comprises male connector 126 and female connector 136, and connector set 118 comprises male connector 128 and female connector 138. Further, within each connector set 112, 114, 116 and 118, each male connector and each female connector is oriented inline with each other. In addition, each male connector and female connector within a connecter set are located equidistant from, and on opposite sides of, the centerline 152 which bisects the side of shape 140 each connector set is located upon. That is, male connector 122 is inline with female connector 132, located equidistant from, and on opposite sides of, centerline 152 which bisects side 142 of shape 140, male connector 124 is inline with female connector 134, located equidistant from, and on opposite sides of, centerline 152 which bisects side 144 of shape 140, male connector 126 is inline with female connector 136, located equidistant from, and on opposite sides of, centerline 152 which bisects side 146 of shape 140, and male connector 128 is inline with female connector 138, located equidistant from, and on opposite sides of, centerline 152 which bisects side 148 of shape 140. There is no requirement that shape 140 and associated connector sets 112, 114, 116 and 118 be located near the edges of board 100 or consistent with the shape of board 100 itself. All that is required is the location of each connector set must be located along at least two sides of shape 140 to ensure symmetry of the connectors sets on a face, each connector set must comprise at least one male and female connector located inline with each other and having a mirrored pinout and located equidistant from centerline 152 which bisects the side of shape 140 on which each connector set is located on to ensure symmetry within each connector set. If connector sets are located on the top and bottom face of board 100, the connector set configuration on the top face is mirrored in the connector set configuration on the bottom face to ensure symmetry between the top and bottom face connector sets. These three points of symmetry allow for the increased compatibility between board connector sets regardless of board rotation about the X, Y or Z axis. In addition it is contemplated equilateral geometric shape 140 has at least three sides, in which case one connector set be comprise each side of the shape. This ensures compatibility with at least one connector set on a second board, regardless of axial rotation of the second board by n/360 degree increments about a X or Y axis where n is the quantity of sides of shape 140 which contain a connector set and/or by rotation by 180 degree increments about the Z axis of board 100. The symmetry of connector sets in location, gender, and orientation on at least one face of the board allows a designer greater flexibility and possibility in the quantity of different boards, each with potentially varied functionality and each utilizing potentially a different connector set pinout, to a system. Further, a specific pinout within a connector set utilized by one peripheral board can be added to a group or system of boards without blocking or limiting the ability to stack, or connect, additional peripheral boards with different pinout usage, via connector sets, with different functionality to the system as well. This leads to better functional encapsulation on the boards without introducing additional design constraints by utilizing one form factor for board and connector set design. Also, if a peripheral board requires more interface pins or more power utilization for example, all of the pins in a connector set may be utilized for such a specific purpose. The same board 100 in the current embodiment can thus utilize four (4) different connector sets and thus four (4) different potential pin configurations per face, all that is needed to connect two boards is for the user to rotate one board (and thus a connector set) to match the appropriate connecter set on the second board and then stack, or plug, the pairing connector sets of each board into each other. It is important to note equilateral shape 140 must have at least three sides to ensure compatibility between multiple instances of board 100, regardless of the axial rotation of a given board. In addition, if shape 140 has an even number of sides, then top face 110 or bottom face 160 must have at least two connector sets located on opposing sides of shape 140 in order to afford increased compatibility with other boards by allowing compatibility through rotation of boards. Although it may be convenient for the shape of board 100 to mimic shape 140 that connector sets 112, 114, 116 and 118 are arranged upon it is not necessary as it is possible a board may need to be larger in size due to design requirements dictated by such instances as component size, board purpose or housing design.

Figure 2:
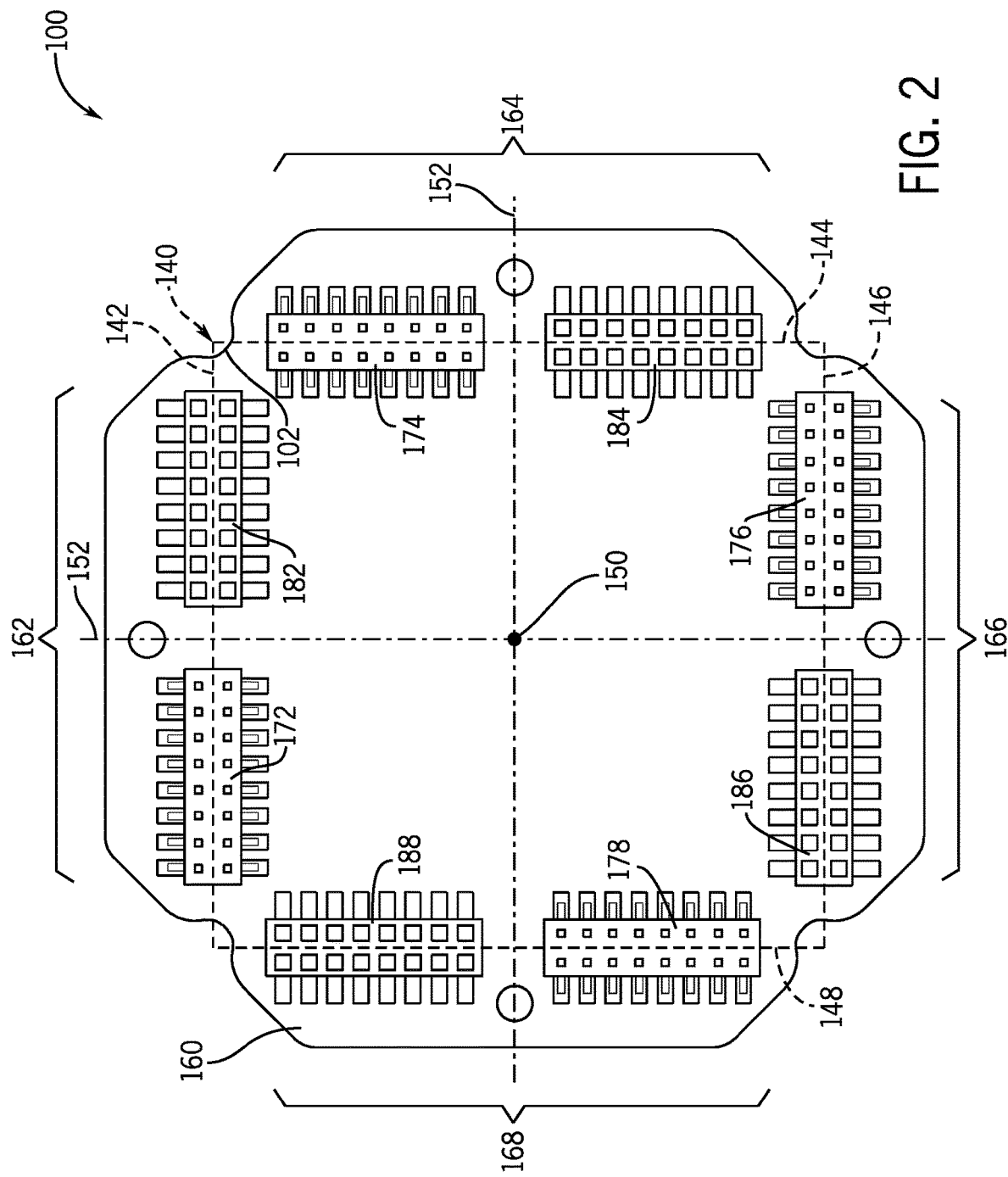
FIG. 2. is a bottom view of an embodiment of the present invention.

Turning to FIG. 2, a bottom view of an embodiment of a stackable printed circuit board 100 is shown. Bottom face 160 comprises a plurality of connector sets 162, 164, 166 and 168 configured in the same geometric shape 140 about a central point 150 as the plurality of connector sets 112, 114, 116 and 118 on top face 110. Further, at least one connector set is located along at least two sides of geometric shape 140 in the same connector set configuration as top face 110. That is, in the current embodiment connector set 162 is located directly underneath, or below, connector set 112, connector set 164 is directly underneath connector set 114, connector set 166 is directly underneath connector set 116 and connector set 168 is directly underneath connector set 118. Further, in the current embodiment connector set 162 is located along the edge of side 142, connector set 164 is located along edge of side 144, connector set 166 is located along edge of side 146 and connector set 168 is located along edge of side 148. In addition, each connector set 162, 164, 166 and 168 comprises an even number of opposing gender connectors per set. That is, each connector set comprises at least one male connector and at least one female connector each with same amount of pins as one another and a mirrored pinout to one another. In the current embodiment, connector set 162 comprises male connector 172 and female connector 182, connector set 164 comprises male connector 174 and female connector 184, connector set 166 comprises male connector 176 and female connector 186, and connector set 168 comprises male connector 178 and female connector 188. Further, within each connector set 162, 164, 166 and 168, each male connector and each female connector is oriented inline with each other. In addition, each male connector and female connector within a connecter set are located equidistant from, and on opposite sides of, the centerline 152 which bisects the side of shape 140 each connector set is located upon. That is, male connector 172 is inline with female connector 182, located equidistant from, and on opposite sides of, centerline 152 which bisects side 142 of shape 140, male connector 174 is inline with female connector 184, located equidistant from, and on opposite sides of, centerline 152 which bisects side 144 of shape 140, male connector 176 is inline with female connector 186, located equidistant from, and on opposite sides of, centerline 152 which bisects side 146 of shape 140, and male connector 178 is inline with female connector 188, located equidistant from, and on opposite sides of, centerline 152 which bisects side 148 of shape 140. Essentially the orientation and configuration of connector sets 112, 114, 116 and 118 on top face 110 is mirrored in the orientation and configuration of connector sets 162, 164, 166 and 168 on bottom face 160. As such, the gender of each connector on top face 100 is paired with a connector of opposite gender located directly below it on bottom face 160. This allows board 100 to be rotated axially along the X, Y or Z axis and board 100 will still be compatible with the connector sets on either the top face 110 or, if applicable, bottom face 160 when stacking multiple instances of board 100. Further, the rotation of board 100 about the X or Y axis by 180 degrees, as discussed above, ensures compatibility between connectors on one board and any additional boards with at least one connector set of the same configuration. As such, in the current embodiment the same board 100 can be designed to utilize up to eight (8) different connector set pin configurations, allowing designers maximum flexibility and reduced design constraints using the same connector set form factor.

Figure 3:
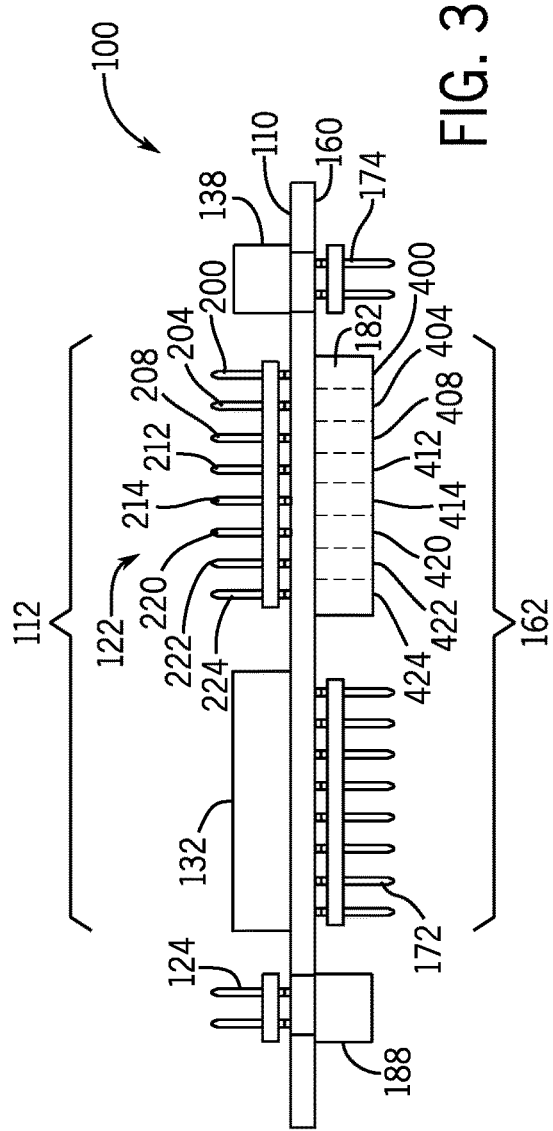
FIG. 3. is a side view of an embodiment of the present invention.

Turning to FIG. 3. The mirroring of connector sets located on the top face 110 and connector sets on the bottom face 160 is further illustrated. Each connector (female connectors 132 and 138 in this case) on top face 110 is situated directly above a connector of opposing gender on the bottom face 160 (male connectors 172 and 174 in this case), hence "mirroring." By maintaining the spacial location and geometric placement of the connectors on the top face 110 and bottom face 160, changing only the gender of the connector in a given location between the top and bottom face, board 100 allows multiple boards with the same connector set configuration to plug into each other or mate by either: (i) stacking a first board on top of a second board either directly without rotation or (ii) rotating the first board axially about the Z axis by n/360 degree increments where n is the number of sides of geometric shape 140 which contain a connector set (4 in this embodiment, thus 90 degree increments) and then stacking the first board on the second board for a possible combination of n*2 different orientations a board may be connected and stacked to a second board, which in the current embodiment is 8 possible combinations. The ability for a single connector set on board 100 to utilize so many different configurations is due to the equilateral geometric shape 140 connector sets are arranged in, the mirroring of connector set configuration between top face 110 and bottom face 160, the even numbering of opposing gender connectors within a connector set, and the inline and equidistant placement of the opposing gender connectors (and thus pins of each connecter) within a connector set on opposing sides of centerline 150 bisecting each side of shape 140 where each connector set is located along. All of these unique aspects establish the symmetry needed to allow so many pin configurations. The plane of mirroring the connector sets located on top face 110 to bottom face 160 is the same whether mirrored about the X, Y or Z axis of board 100.

Figure 4:
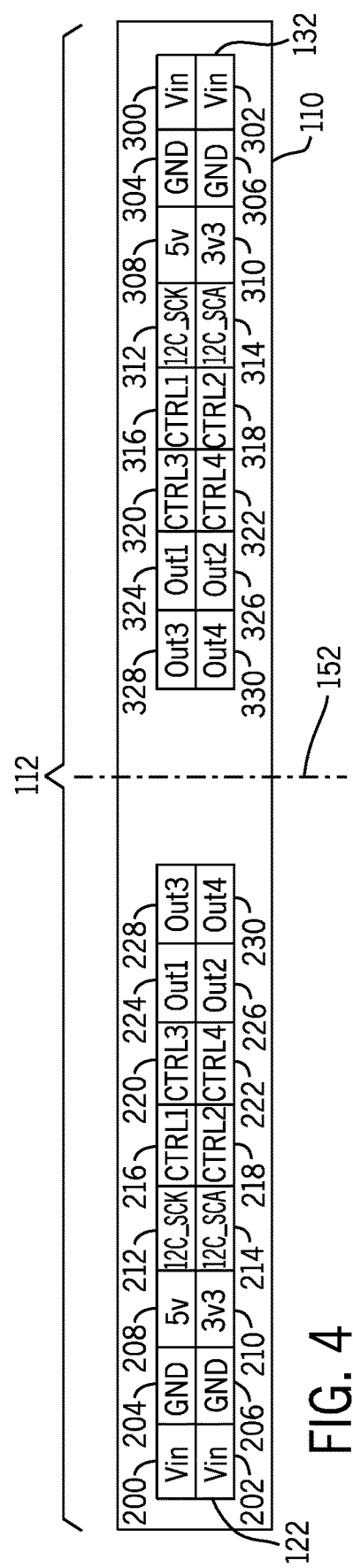
FIG. 4. is a pinout diagram of a connector set of an embodiment of the present invention.

Turning to FIG. 4, an example of a pinout arrangement for connector set 112 is shown. Male connector 122 and female connector 132 is comprised of pins and socket headers to provide input to and output from board 100. In the current embodiment male connector 122 comprises pins 200, 202, 204, 206, 208, 210, 212, 214, 216, 218, 220, 222, 224, 226, 228 and 230 arranged in two rows from eight pin strip surface mount headers. In the current embodiment female connector 132 comprises sockets 300, 302, 304, 306, 308, 310, 312, 314, 316, 318, 320, 322, 324, 326, 328 and 330 arranged in two rows from eight position socket assemblies. Any quantity and size connectors may be used as required by a specific design need, such as 12 pin for example. In the current embodiment 2.00 mm are utilized. As shown in FIG. 4 the functionality pinout of male connector 122 mirrors the functionality pinout of female connector 132 about centerline 152. That is, pins 200 and 202 is used for voltage input (Vin), pins 300 and 302 is also used for voltage input (Vin); pins 204 and 206 is used for ground (GND), pins 304 and 306 is also used for ground (GND); pins 208 and 210 is used for power (5V and 3.3V), pins 308 and 310 is also used for power (5V and 3.3V); pins 212 and 214 is used for bus, pins 312 and 314 are used for bus; pins 216, 218, 220, 222, 224, 226, 228 and 230 are used for communication signals between board 100 and other boards and pins 316, 318, 320, 322, 324, 326, 328 and 330 are used for communication signals between board 100 and other boards. Although the functionality purpose of the mirrored pins in a connector set is the same, each mirrored pin is not necessarily connected or related. For example, pins 224, 226, 228 and 230 in male connector 122 for signal output is not necessarily related to or connected to pins 324, 326, 328 and 330 on female connector 132 for data output. The mirroring of pin functionality within a connector set allow for increased compatibility between different uses of board 100 and also reduces design constraints due to usage of special pins for specific board purposes. If a particular board 100 needs a specific pin, or multiple pins in a connector set, board 100 can accommodate such needs without hindering the ability to stack or add additional boards to a system. Further, each connector set (112, 114, 116, 118, 162, 164, 166 and 168) on board 100 has the same mirrored pinout and configuration. In addition there is no limit on the amount of pins in a connector (and thus a connector set), the pin count can be decreased or increased as desired however all connectors in a connector set must at least have the same amount of pins, and the pin functionality be mirrored as just described.

Turning back to FIG. 3, each connector within a connector set on the top 110 of board 100 is electrically connected to the connector located directly below it on bottom face 160.

More specifically the pin on top 110 within each male and female connector within each connector set is electrically connected to the pin of the connector (which is of opposing gender) located directly below it on bottom 160. By example, pin 200 of connector 122 is electrically connected to pin 400 of connector 182. Likewise, pins 204, 208, 212, 214, 220, 222 and 224 of connector 122 is electrically connected to pins 404, 408, 412, 414, 420, 422 and 424 of connector 182. The manner in which each electrical connection is made depends on the type of connector used. Ideally surface mount connectors are used which utilize vias to connect the copper layers in which each pin within each connector is electrically connected to both top 110 and bottom 160 face of board 100. To avoid the use of vias through hole connectors could be used however surface mount connectors make the circuit board manufacturing process easier and less costly.

Figure 5:
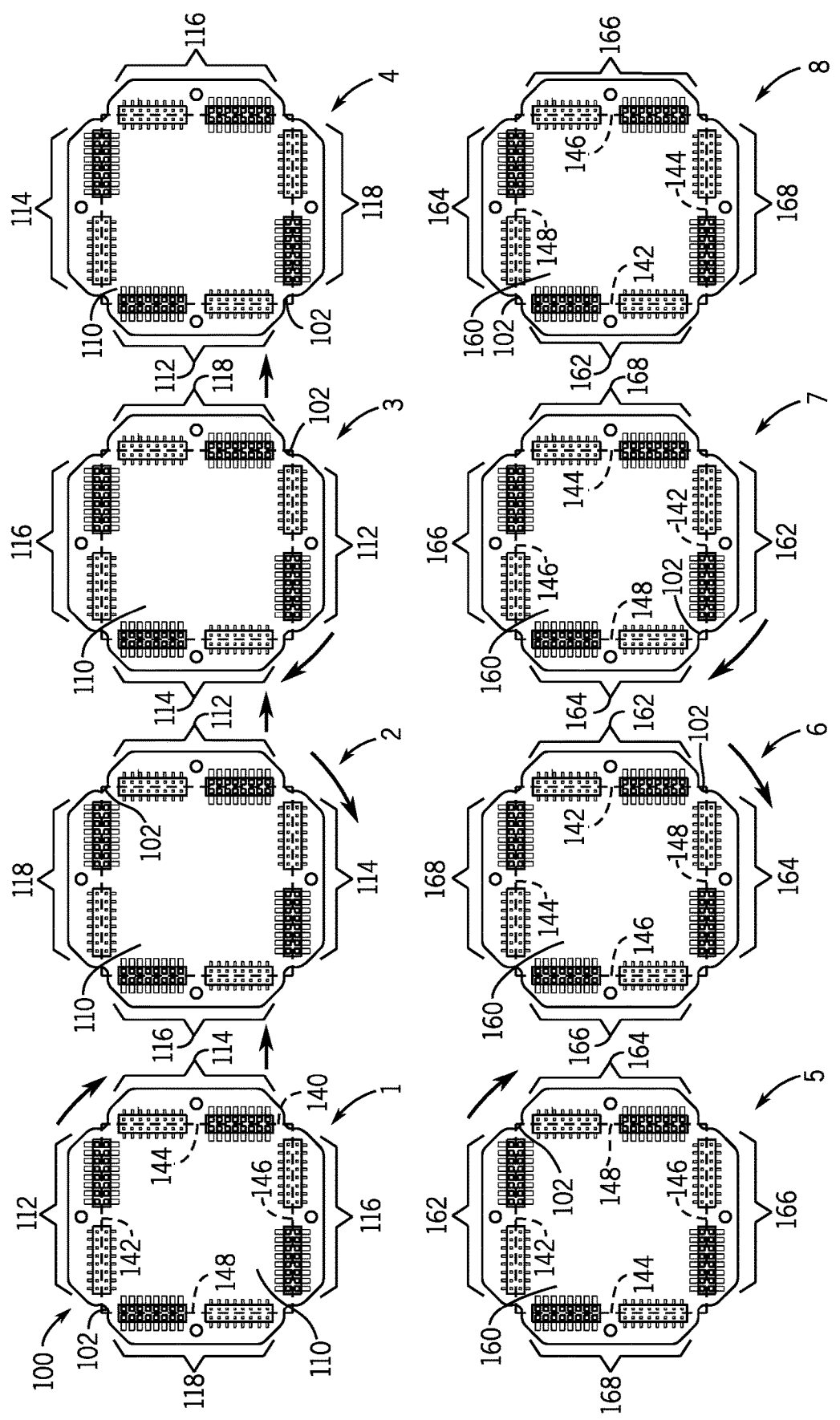
FIG. 5. is a top view of alternative connector set configurations of an embodiment of the present invention.

Turning to FIG. 5, an illustration of the different ways board 100 could be rotated and stacked to utilize a specific connector set is shown. Position 1 illustrates top 110 of board 100 with four connector sets 112, 114, 116 and 118 configured in quadrilateral shape 140 with sides 142, 144, 146 and 148. For ease of illustration just connector set 112 will be referenced. Connector set 112 is located alongside 142. By rotating board 100 clockwise by 90 degrees position 2 is obtained. By rotating board 100 clockwise by another 90 degrees position 3 is obtained. By rotating board 100 clockwise by another 90 degrees position 4 is obtained. By rotating board 100 clockwise by another 90 degrees board 100 is back to position 1. As seen in positions 1, 2, 3 and 4, although connector set 112 has changed spacial location in each position (in order to plug connector set 112 into a specific connector set of another board), the overall the spacial orientation of all connector sets is maintained. In this manner the same board 100 form factor can be designed to use 4 different pinout configurations or purposes (one for each connector set 112, 114, 116 and 118) without having to sacrifice compatibility with other peripheral or terminating boards with different connector set pinout configurations or purposes. Further, by rotating board 100 about the X or Y axis by 180 degrees, or flipping over board 100 either horizontally or vertically, bottom 160 provides an additional possible four positions 5, 6, 7 and 8. Thus up to 8 different connector sets is available for additional boards to utilize.

Board 100 may also contain at least one notch 102 in at least one corner. Notch 102 aids in assembly of a system of multiple boards to make sure that board 100 is positioned by flipping over and/or rotating board 100 to utilize a specific connector to plug into a second board connector set designed for the purpose of board 100. One example would be to line up each notch 102 of each board 100 in a system to ensure board orientation agrees with the overall system design. Often during board installation and servicing it can be difficult to visually see the appropriate way to orient board 100 to plug into a system of boards since the connector set configuration is visually symmetrical to other boards in the system, thus notch 102 provides a visual and physical indicator of how to orient board 100 to utilize a specific connector set on a board in the system.

Figure 6:
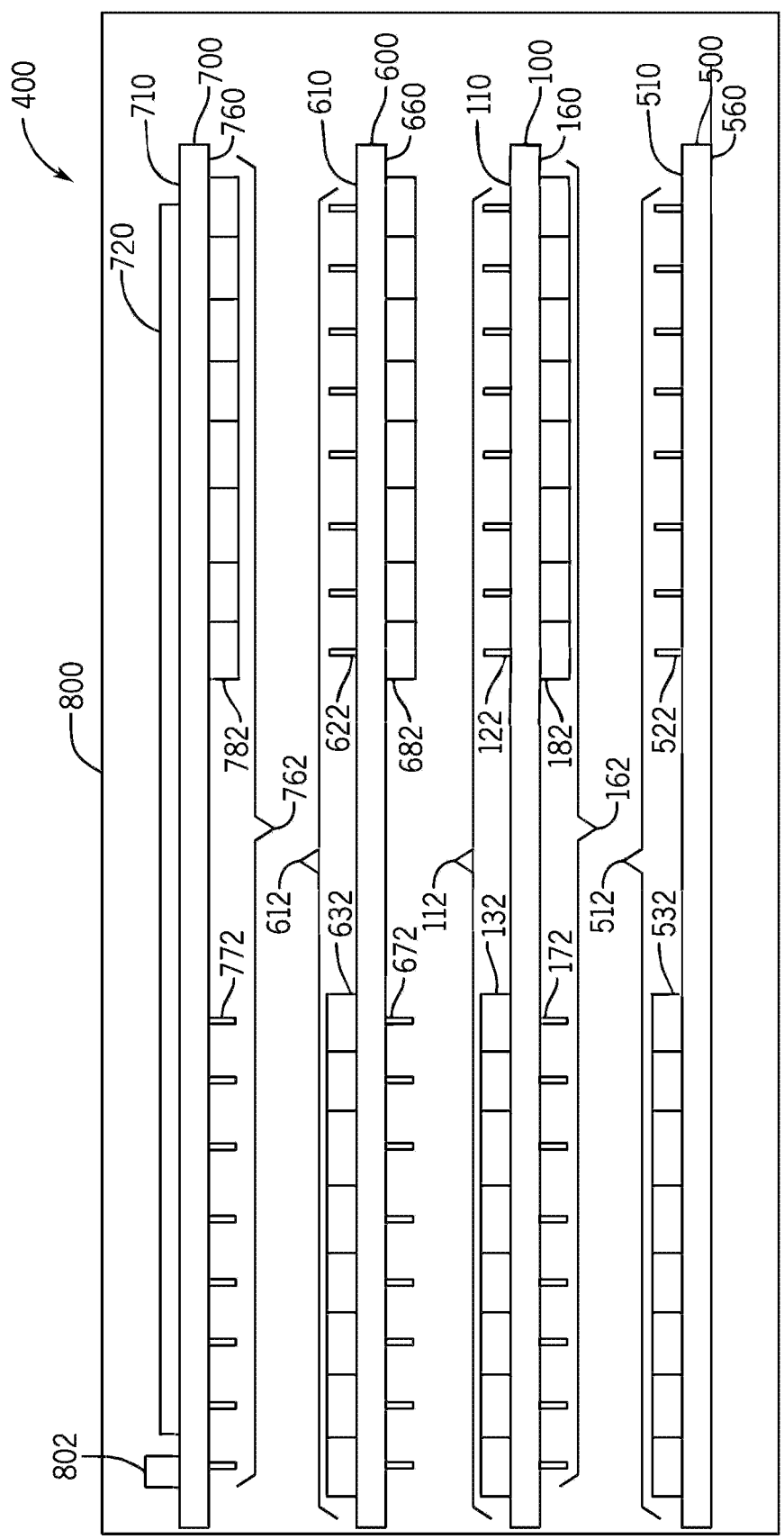
FIG. 6. is an embodiment of the present invention as a system.

Turning to FIG. 6, an embodiment of a stackable printed circuit board system 400 is shown comprising a lower termination board 500 and printed circuit board 100. Lower termination board 500 has at least one connector set 512 comprised of male connector 522 and female connector 532 configured to mate with connector set 162 of board 100 or connector set 112 if board 100 is flipped over. Terminating board 500 is most commonly a single board computer or motherboard with at least a central processing unit. Circuit board 100 could be any desired peripheral board, shield, or expansion board. Further, additional boards can be added, or stacked, on top of board 100 for additional functionality in quantity or type. If additional design characteristics are desired such as power, input/output pins, or noise reduction which often each require unique use of pins in a connector set, board 100 and all subsequent boards 600 can be rotated in 90 degree increments for usage of 4 different possible connector set pin configurations. Each subsequent board 600 is virtually identical to board 100 in at least the spacial configuration and orientation of connector sets on top 610 and bottom 660 of the board. If further configurations are required board 100 and/or boards 600 can be flipped over, and if necessary, rotated in 90 degree increments for 4 additional connector set pin configurations, for a total of 8 different design configurations possible using the same board 100 form factor. This makes manufacturing inexpensive and effective as well as maximizing customizability. It should be noted that the number of additional boards 600 utilizing unique connector set pinouts is limited only by the amount of connector sets on board 600, which is limited by the shape 140 of the connector sets. Thus, if an equilateral hexagon shape is used, a total of 6 connectors sets per side would afford up to 12 additional unique boards to be added to system 400. If multiple boards providing the same functionality (and thus connector set pinout) are desired, the only limitation is the size of the housing maintaining the system. In addition, there is no limit on which type of peripheral boards are added to the system, only on the number of peripheral boards added to the system. In addition, a termination board may be also be used if desired, such as for end user input or output. Upper termination board 700 includes at least one connector set 762 comprising male connector 772 and female connector 782 on bottom face 760 and may include a display 720 or other type of output on top face 710 for output. It is contemplated that multiple upper termination boards may connect to board 600, as such upper termination board 700 requires at least one connector set 762 to connect, or plug into, the pairing connector set on the board below it (board 600, and connector set 612 in this case). Further, using a consistent connector set configuration for lower terminating board 500, boards 100 and 600, and upper terminating board 700, space is used efficiently and allows for efficient housing 800 design and troubleshooting of the system. Enclosures or housings for the system can also be designed to follow a similar flip/rotate/stack feature that include options for environmental sealing and external mounting.

While the present invention has been described above in terms of specific embodiments, it is to be understood that the invention is not limited to these disclosed embodiments. Many modifications and other embodiments of the invention will come to mind of those skilled in the art to which this invention pertains, and which are intended to be and are covered by both this disclosure and the appended claims. It is indeed intended that the scope of the invention should be determined by proper interpretation and construction of the appended claims and their legal equivalents, as understood by those of skill in the art relying upon the disclosure in this specification and the attached drawings.

What is claimed is:

1. A stackable printed circuit board comprising:
   a top face further comprising at least a first connector set configured along a first side of an equilateral geometric shape about a central point and at least a second connector set configured along a second side of the equilateral geometric shape where the second side is located opposite the side the first connector set is configured; and
a bottom face further comprising at least a third connector set in a mirrored configuration to the at least first connector set on the top face and at least a fourth connector set in a mirrored configuration to the at least second connector set on the top face, wherein each connector set further comprises a male connector and a female connector with a mirrored pin configuration and located inline with one another.

2. A stackable printed circuit board according to claim 1, wherein the board has a notch in at least one corner.

3. A stackable printed circuit board according to claim 1, wherein the equilateral geometric shape has at least three sides.

4. A stackable printed circuit board comprising:
a top face further comprising at least one connector set configured along each side of an equilateral geometric shape about a central point; and
a bottom face further comprising at least one connector set configured along each side of the equilateral geometric shape about the central point arranged in a mirrored configuration to the at least one connector set configured along each side of the shape on the top face,
wherein each connector set further comprises at least one male connector and at least one female connector having a mirrored pin configuration and arranged inline with one another and located equidistant from a centerline bisecting the side of the shape where each connector set is located.

5. A stackable printed circuit board according to claim 4, wherein male connector is comprised of two rows of 2.0 mm strip surface mount headers.

6. A stackable printed circuit board according to claim 4, wherein female connector is comprised of two rows of 2.0 mm socket assemblies.

7. A stackable printed circuit board according to claim 4, wherein the male and female connectors are electrically connected to both the top face and bottom face of the board.

8. A system of stacked printed circuit boards comprising:
a termination board comprising:
a top face further comprising at least a first connector set configured along one side of an equilateral geometric shape about a central point and at least a second connector set configured along a second side of the equilateral geometric shape, wherein the first side is opposite the second side and the first and second connector set is the same composition; and
at least one peripheral board comprising:
a top face further comprising at least a first connector set configured along one side of an equilateral geometric shape about a central point and at least a second connector set configured along a second side equilateral geometric shape, where in the first side and second side are opposite one another; and
a bottom face further comprising a third connector in a mirrored configuration to the first connector set on the top face and a fourth connector set in a mirrored configuration as to the second connector set on the top face, wherein the first, second, third and fourth connector set are the same composition,
wherein each connector set further comprises at least one male connector and at least one female connector having a mirrored pin configuration and arranged inline with one another and located equidistant from a centerline bisecting the side of the shape where each connector set is located and at least one connector set on the top or bottom face of the peripheral board mate with at least one connector set on the top face of the termination board regardless of the axial rotation of the peripheral board in n/360 degree increments about the Z axis or 180 degree increments about the X or Y axis, where n is the quantity of sides of the equilateral geometric shape which contain a connector set.

9. A system of stacked printed circuit boards of claim 8 further comprising a second termination board which mates with the connector sets on the top and bottom face of the peripheral board.

10. A system of stacked printed circuit boards of claim 8 where the termination board contains a display on the top face.

11. A system of stacked printed circuit boards of claim 8 where the termination board contains at least one input button on the top face.

12. A system of stacked printed circuit boards of claim 8 further comprising a housing.

13. A method for stacking printed circuit boards comprising: rotating a first printed circuit board axial about a Z axis by n/360 where n is the amount of connector sets on the top or bottom face of the printed circuit board and about the X or Y axis by 180 degrees, and then mating the connector sets on the first printed circuit board with the connector sets on the top face or bottom face of a second printed circuit board.

14. The method for stacking printed circuit boards of claim 13 further comprising a step of orienting the first board to mate with the second board according to a desired position of a notch in the first board.

\* \* \* \* \*